(12) United States Patent
Ludwig

(10) Patent No.: US 8,904,864 B2
(45) Date of Patent: Dec. 9, 2014

(54) ELECTRONIC COMPONENT AND METHOD FOR MANUFACTURING THE ELECTRONIC COMPONENT

(75) Inventor: Ronny Ludwig, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 328 days.

(21) Appl. No.: 13/376,439

(22) PCT Filed: Apr. 23, 2010

(86) PCT No.: PCT/EP2010/055460
§ 371 (c)(1),
(2), (4) Date: Feb. 29, 2012

(87) PCT Pub. No.: WO2010/142491
PCT Pub. Date: Dec. 16, 2010

(65) Prior Publication Data
US 2012/0144914 A1    Jun. 14, 2012

(30) Foreign Application Priority Data
Jun. 8, 2009  (DE) .......................... 10 2009 026 806

(51) Int. Cl.
*G01P 15/00*    (2006.01)
*H05K 13/00*    (2006.01)
*H05K 5/00*    (2006.01)
*G01D 11/24*    (2006.01)

(52) U.S. Cl.
CPC ............ *H05K 5/0095* (2013.01); *G01D 11/245* (2013.01)
USPC ......................................... 73/493; 73/866.5

(58) Field of Classification Search
USPC ........... 73/488, 756, 493, 866.5; 439/73, 818, 439/331; 29/412; 24/108
See application file for complete search history.

(56) References Cited

U.S. PATENT DOCUMENTS

| | | | | | |
|---|---|---|---|---|---|
| 4,430,777 | A | * | 2/1984 | Takeda | 24/681 |
| 5,225,897 | A | * | 7/1993 | Reifel et al. | 257/787 |
| 6,354,153 | B1 | * | 3/2002 | Weiblen et al. | 73/756 |
| 6,644,117 | B1 | * | 11/2003 | Kueck et al. | 73/488 |
| 6,758,691 | B1 | * | 7/2004 | McHugh et al. | 439/331 |
| 8,042,248 | B2 | * | 10/2011 | Shih et al. | 29/414 |
| 2005/0014411 | A1 | * | 1/2005 | Ma | 439/331 |
| 2007/0216105 | A1 | * | 9/2007 | Fessele et al. | 277/318 |

FOREIGN PATENT DOCUMENTS

DE    19928917 A1 * 12/2000
DE    19948613 A1 * 4/2001

OTHER PUBLICATIONS

Dr. Josef Raabe, Classic sheet metal processing in new dimensions-punching, nibbling, forming, 1996.*

* cited by examiner

*Primary Examiner* — Hezron E Williams
*Assistant Examiner* — Xin Zhong
(74) *Attorney, Agent, or Firm* — Kenyon & Kenyon LLP

(57) ABSTRACT

AN electronic component includes at least one microcomponent which is contacted with, and fastened to, a support element. The support element includes a spring element which is configured for fastening the microcomponent, and the spring element is engaged in the support element with the aid of a detent in order to fasten the microcomponent to the support element.

17 Claims, 10 Drawing Sheets

(A)

(X-X)

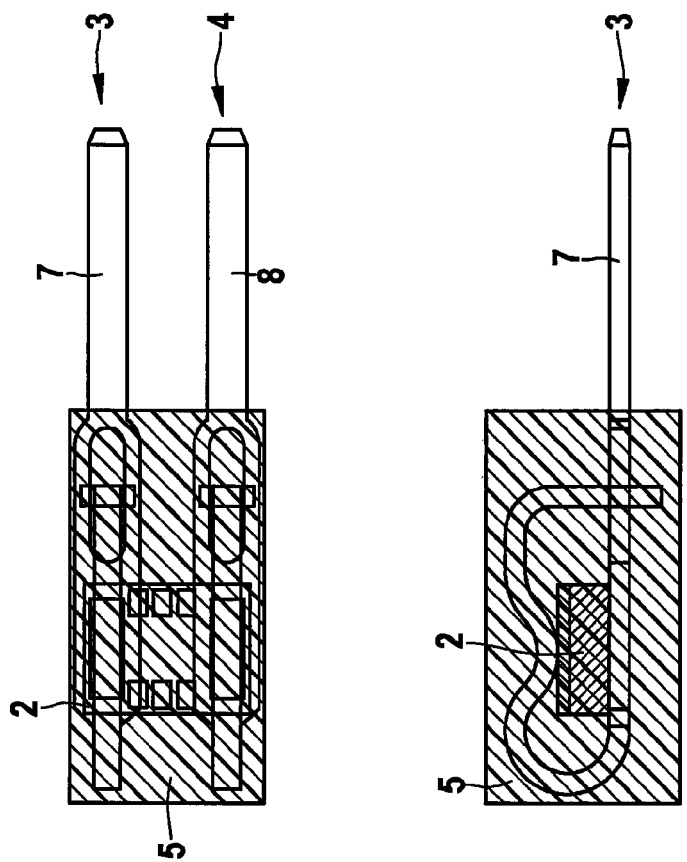
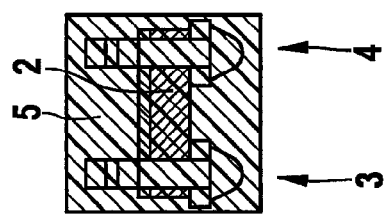
Fig. 14

ELECTRONIC COMPONENT AND METHOD FOR MANUFACTURING THE ELECTRONIC COMPONENT

BACKGROUND OF THE INVENTION

1. Field of the Invention

The present invention relates an electronic component, e.g., an acceleration sensor for use in a motor vehicle, having a microcomponent which is contacted with and fastened to a support element, and a method for manufacturing the electronic component.

2. Description of Related Art

Known designs in assembly and connection technology of microcomponents, in particular sensors, use increasingly miniaturized and fully integrated approaches for representing the function. Housing designs for "packaging" of sensor chips, for example land grid arrays (LGA), integrate all components of a circuit in a tiny housing only a few cubic millimeters in size. Such miniaturized circuits represent an enormous challenge for so-called "second-level packaging," i.e., further processing to form a sensor having fastening capability and a plug. Since such miniaturized circuits such as LGAs, for example, no longer require a printed circuit board or other circuit substrates, they are typically mounted directly in the surrounding sensor housing. In systems according to the related art, microcomponents are typically contacted using metallic support strips or support elements. Thermal joining processes such as soldering, conductive adhesion, or welding are used for fixing and establishing contact of the microcomponent and the support element. The soldering process is preferably used, but this also involves risks and problems. This results, for example, in thermal stress on the joints, solder balls, solder cavities, and, not least of all, organic residues of the fluxing agent. These organic residues may interact with silicone, which is used as housing material. Another problem is the shear effect or shear force between pre-tin plated contact pads of the microcomponent and the metallic support strips or support elements, which occurs when the microcomponent is contacted. The shear effect results in damage in the form of scratches, and there is the risk of splinter formation. Since the microcomponent has only very small distances between the potential-conducting measuring pads and programming pads due to its small dimensions, even the tiniest metallic conductive particles and splinters may result in a short circuit.

BRIEF SUMMARY OF THE INVENTION

The electronic component according to the present invention allows a high contact force to be applied between the microcomponent and the support element without thermal joining processes such as soldering, conductive adhesion, or welding. This high contact force also allows secure fastening or fixing of the microcomponent to the support element, as well as secure electrical or electronic contact between the support element and the microcomponent. In addition, the contact force is transmitted without friction and thus without damage to the contact points, thus avoiding scratches and splinter formation. Thermal stress on the microcomponent is largely avoided by not using the thermal mounting method. As a result, there is also no contamination from solder balls, flux residues, traces of smoke, adhesive residues from silver conductive adhesion, or the like. Furthermore, the electronic component may be manufactured in a very cost-effective manner for the following reasons: one important reason for the cost-effective manufacture is that the device according to the present invention requires no printed circuit board or substrate. Operationally reliable use of a miniaturized microcomponent, in particular an LGA housing, is thus possible. Complexity in the mounting process is reduced by avoiding thermal joining methods. This avoidance of thermal joining methods also increases the environmental compatibility of the electronic component, since the use of all lead-containing materials is avoided. Lastly, a very inexpensive electronic component results which is advantageously used in particular in the automotive field as an acceleration sensor, for example for airbags. This is all achieved using an electronic component, including at least one microcomponent, which is contacted with and fastened to a support element, the support element including a spring element which is designed for fastening the at least one microcomponent, and the spring element being engaged in the support element with the aid of a detent in order to fasten the at least one microcomponent to the support element. The support element is preferably designed for a single microcomponent as well as for multiple microcomponents. To simplify the description, the variant having one microcomponent is discussed below.

In one preferred embodiment of the electronic component according to the present invention, it is provided that the support element and the spring element are integrally produced, in particular from bent sheet metal. The support element may thus be produced in one piece in a cost-effective manner.

The spring element advantageously includes a contact spring section which is designed for contacting the microcomponent and the support element. The contact between the microcomponent, in particular the contact pads of the microcomponent, and the support element is thus established via a specific section, namely, the contact spring section, of the spring element.

It is also advantageously provided that the support element includes a microcomponent support, the microcomponent support merging into a main spring section of the spring element, the main spring section merging into the contact spring section, the spring element terminating at at least one locking tab of the detent, and a locking groove of the detent being provided on the microcomponent support. The mounted microcomponent comes to rest on this microcomponent support, the contact pads of the microcomponent advantageously facing the contact spring section so that the latter is able to establish electrical or electronic contact with the contact spring section. When the detent is locked, i.e., the locking tab is engaged with the locking groove, the spring element is connected to the support element at two points. On one side of the microcomponent support the microcomponent support merges directly into the main spring section, while on the other side of the microcomponent support the microcomponent support is connected to the spring element via the detent.

In one preferred embodiment, it is provided that the support element is designed for inserting the microcomponent between the contact spring section and the microcomponent support, the contact spring section being curved toward the microcomponent support. As a result of this curved shape of the contact spring section, on the one hand this contact spring section itself is elastic and therefore represents a type of spring. On the other hand, due to the U-shaped or curved design, the contact spring section rests essentially along a contact line on the contact pad of the microcomponent, resulting in a relatively large force and thus achieving relatively good contact between the contact spring section and the contact pad. In another advantageous embodiment, the main spring section acts upon the contact spring section in a direction opposite from the clamping of the microcomponent, and the detent prevents a motion of the contact spring section in the opposite direction from this clamping. This means that the main spring section holds the spring element open and thus at a distance from the microcomponent support, while the engaged detent pulls the spring element toward the microcomponent support, thus allowing the microcomponent to be clamped.

In another advantageous embodiment of the detent, it is provided that at least one wall of the locking groove and/or the locking tab is/are elastically deformable. This facilitates locking of the detent and thus ensures a simple mounting process.

In one advantageous embodiment, the electronic component according to the present invention includes two support elements which are separated from one another, each of the support elements including a spring element and a detent in order to fasten and contact the microcomponent with the aid of both support elements. Of course, all advantageous embodiments previously described or described below in conjunction with only one support element are also applicable to these two support elements, both support elements advantageously having identical designs in order to minimize the number of different parts.

In another advantageous embodiment of the electronic component having two separate support elements, it is provided that the microcomponent includes two contact pads which are connected to a connecting pin provided on the support element via one contact spring section each. For this purpose, one connecting pin is provided for each support element. The connecting pins allow, for example, formation of a connection contact to a plug or a cable. The connecting pins function as a plug-in contact, for example, for connecting the electronic component to a bus system of a motor vehicle.

In another preferred embodiment, the electronic component includes a first plastic coating and a second plastic coating, which together form the housing, i.e., the so-called second-level packaging. The first plastic coating encapsulates the microcomponent together with at least a portion of the support element and/or the support elements. Interfaces, in particular molded fastening elements and molded connecting elements, for connecting the electronic component are provided on the second plastic coating. An advantageous material of the first plastic coating is silicone, and of the second plastic coating, a thermoplastic. The advantageously used manufacturing method is a two-component injection molding process, in which the microcomponent, which is connected to at least one support element, is initially extrusion-coated in a first step with a relatively soft material, for example silicone. This construct composed of the first plastic coating, the microcomponent, and the support element is extrusion-coated in the injection molding process in a second step using a housing plastic, in particular a thermoplastic. As a result of this two-component extrusion coating, the second plastic coating may be customized in arbitrary form. Customized plug-in systems for connecting the electronic component according to the present invention to interfaces of the customer may be designed in this way. Since relatively high pressures are used in particular for extrusion coating of the second plastic coating, it is particularly advantageous to use a relatively soft first plastic coating in order to protect the sensitive microcomponent from excessive stress.

Moreover, the present invention includes a sensor, e.g., an acceleration sensor, for use in a motor vehicle, which includes an electronic component described above, the microcomponent including a microelectromechanical sensor. Of course, the advantageous embodiments discussed within the scope of the electronic component according to the present invention are also applicable to the sensor according to the present invention for use in the motor vehicle.

Moreover, the present invention includes a sheet metal punching strip which is designed for use in manufacturing the electronic component discussed above, multiple support elements which include a spring element and a detent being connected to one another via die-cuttable connecting regions. A plurality of support elements may thus be adjacently situated in a punching strip, and may be separated from one another using a punching process. The previously discussed advantageous embodiments of the support elements are found in corresponding form in the punching strip according to the present invention. The shape of the entire support element advantageously allows an arrangement in such a sheet metal punching strip according to the present invention. Metal plating processes in a conveyorized metal-plating system are thus advantageously possible.

Moreover, the present invention includes a method for manufacturing an electronic component, in particular an acceleration sensor for use in a motor vehicle, including the following steps: providing a support element having a spring element which is designed for fastening a microcomponent, inserting the microcomponent between a contact spring section of the spring element and a microcomponent support of the support element, closing the spring element against an elastic force, and engaging a detent between the spring element and the support element. The elastic force against which closing is carried out is advantageously generated in a main spring section of the spring element. Of course, the previously discussed advantageous embodiments of the electronic component according to the present invention as well as the sheet metal punching strip according to the present invention are correspondingly applicable in conjunction with the method according to the present invention for manufacturing the electronic component.

BRIEF DESCRIPTION OF THE DRAWINGS

FIG. 14 shows three views of the electronic component according to the present invention, according to the first exemplary embodiment with a first plastic coating.

DETAILED DESCRIPTION OF THE INVENTION

FIGS. 1 through 16 show an electronic component in different process or manufacturing steps according to a first exemplary embodiment.

Figure 1:
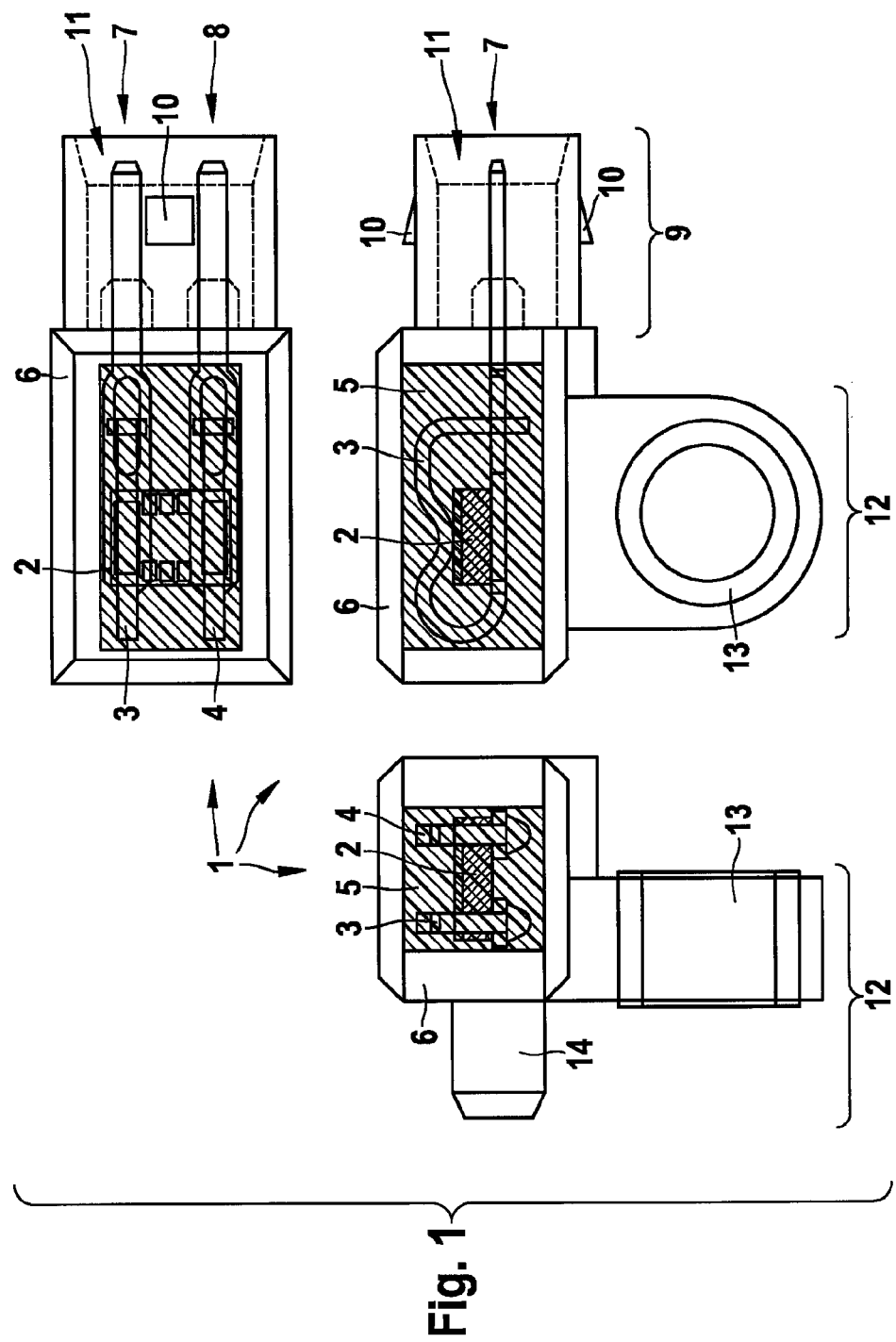
FIG. 1 shows three partially see-through views of the completed electronic component according to the present invention, according to a first exemplary embodiment.

FIG. 1 shows three partially see-through views and a partial sectional view of an electronic component 1. This electronic component 1 is composed of a microcomponent 2, a first support element 3, a second support element 4, a first plastic coating 5, and a second plastic coating 6. Microcomponent 2 is clamped into first support element 3 and second support element 4, and is contacted with same. The entire microcomponent 2 and a portion of first support element 3 and of second support element 4 are encased by first plastic coating 5 made of silicone, and by second plastic coating 6 made of a thermoplastic. A first connecting pin 7 of first support element 3 and a second connecting pin 8 of second support element 4 remain free from first plastic coating 5 and from second plastic coating 6, thus allowing contacting of the entire electronic component with a plug or a cable, for example to a vehicle bus system, via first connecting pin 7 and second connecting pin 8.

In particular for the customized version, second plastic coating 6 includes a molded connecting element 9, designed as a plug-in contact, and a molded fastening element 12. This molded connecting element 9 and this molded fastening element 12 represent interfaces of electronic component 1. Molded connecting element 9 includes a cavity 11. First connecting pin 7 and second connecting pin 8 protrude into this cavity 11. Molded connecting element 9 also includes a plug retainer 10 on its exterior. This plug retainer 10 allows, for example, a detent connection with a plug.

Molded fastening element 12 includes an extrusion-coated socket 13 and antitwist protection 14. Extrusion-coated socket 13 is a metal insert which has been extrusion-coated during application of second plastic coating 6, and which represents a screw-on option, for example at an interface in the motor vehicle. Antitwist protection 14, designed as a peg, extends in the direction of a center axis of extrusion-coated socket 13, and thus allows the rotationally fixed mounting of electronic component 1 using only one screw or one bolt.

As is apparent in FIG. 1, first support element 3 as well as second support element 4 are not visible in every view. However, it is important to note that, regardless of whether or not both support elements 3, 4 are illustrated, the two support elements of electronic component 1 are identical. Thus, some embodiments of the support elements are described below only with reference to first support element 3. However, the embodiments of first support element 3 likewise apply to second support element 4.

Figure 2:
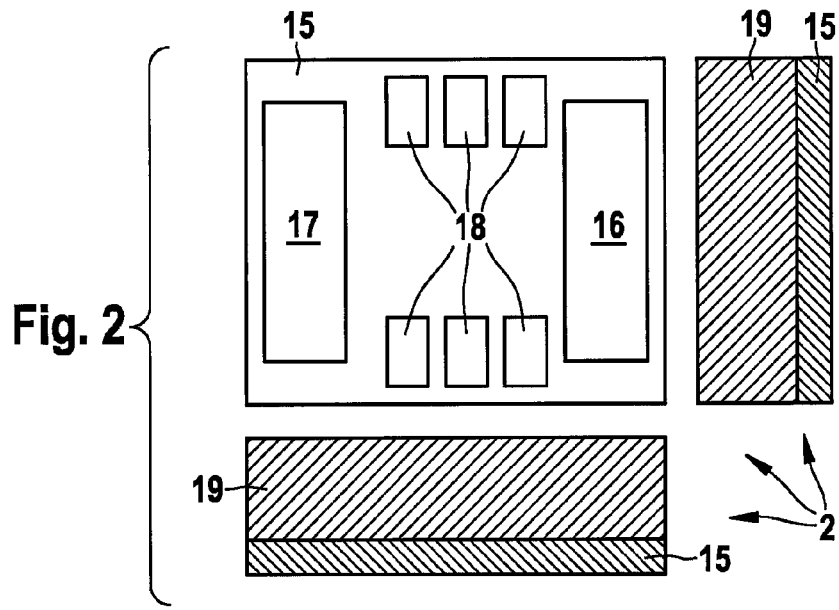
FIG. 2 shows a bottom view and two side views of a microcomponent according to the first exemplary embodiment.

FIG. 2 shows microcomponent 2, designed as an LGA package, as used in electronic component 1 according to the first exemplary embodiment. A printed circuit board 15, a first contact pad 16, a second contact pad 17, and six programming pads 18 are visible on the illustrated bottom side of the microcomponent. In the two cross-sectional side illustrations it is seen that a casing 19, provided as molding compound, is located on printed circuit board 15.

Figure 3:
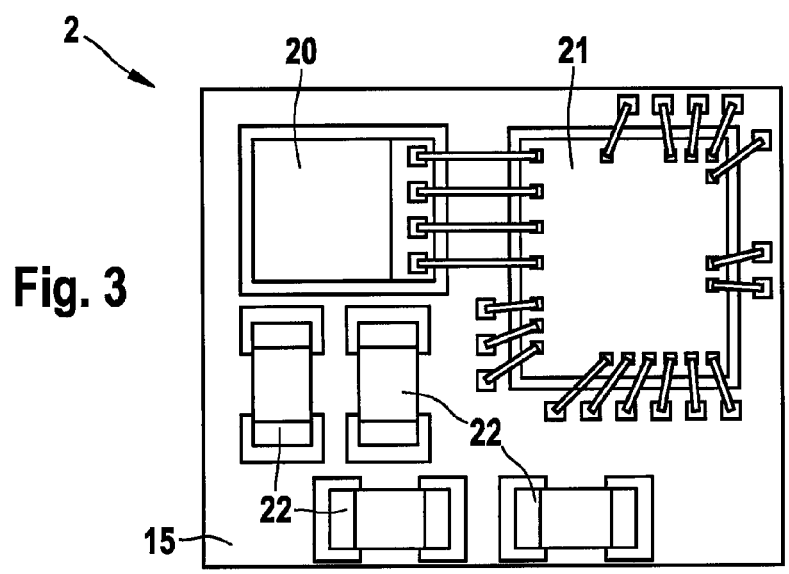
FIG. 3 shows one possible arrangement of electronic components within the microcomponent according to the first exemplary embodiment.

FIG. 3 illustrates microcomponent 2 according to FIG. 2 in a top view, casing 19 being omitted in order to show the interior of microcomponent 2. Thus, FIG. 3 shows how a sensor 20, designed as a microelectromechanical sensor for recording acceleration, an application-specific integrated circuit (ASIC) 21, and four additional electronic components (SMD) 22 are situated on printed circuit board 15. Sensor 20, application-specific integrated circuit 21, and the various electronic components 22 are encapsulated by casing 19.

Thus, FIGS. 2 and 3 show how a microcomponent 2, to be used as an example and designed as an LGA housing, may be used. The very thin printed circuit board 15 supports the layout of microcomponent 2 composed of sensor 20, application-specific integrated circuit 21, and various passive electronic components 22. All of these components are enclosed by a molding compound (coating 19) in the form of an epoxy resin. This microcomponent 2 has been produced within a large matrix. This means that many of these microcomponents 2 have been simultaneously produced and cut into cubes using a suitable separating process such as sawing or a laser. The typical two contact pads 16 and 17 and six programming pads 18 for programming or testing microcomponent 2 are located on the bottom side of printed circuit board 15, as illustrated in FIG. 2, which is not covered by coating 19.

Figure 4:
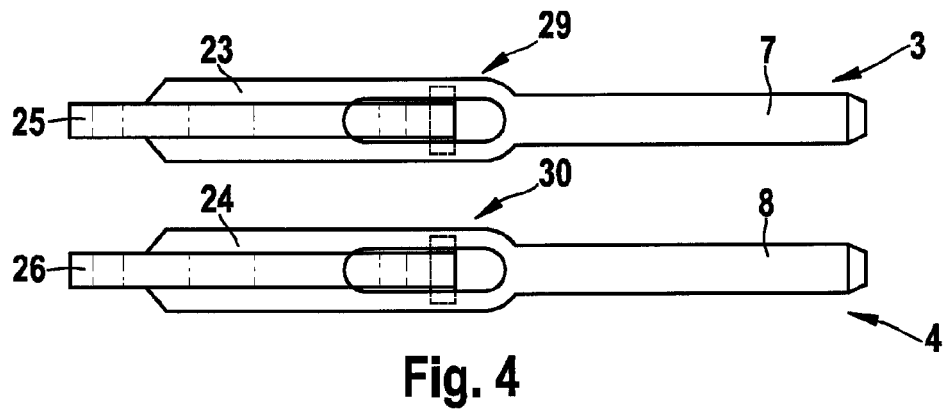
FIG. 4 shows a top view of two support elements according to the first exemplary embodiment.
Figure 5:
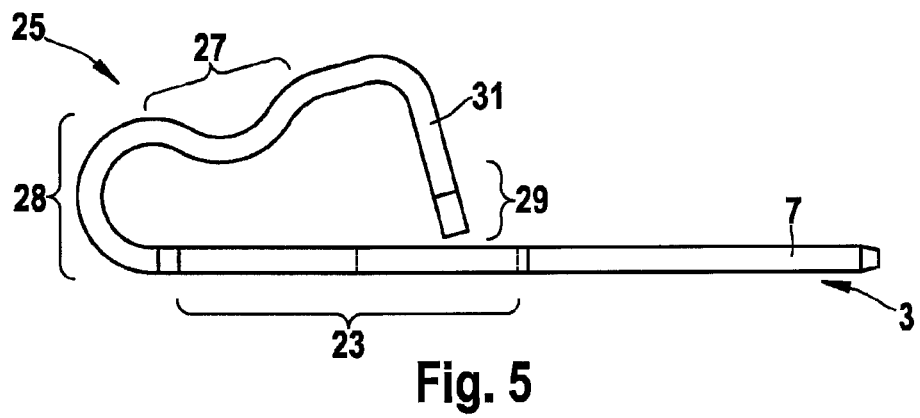
FIG. 5 shows a side view of a support element according to the first exemplary embodiment.
Figure 6:
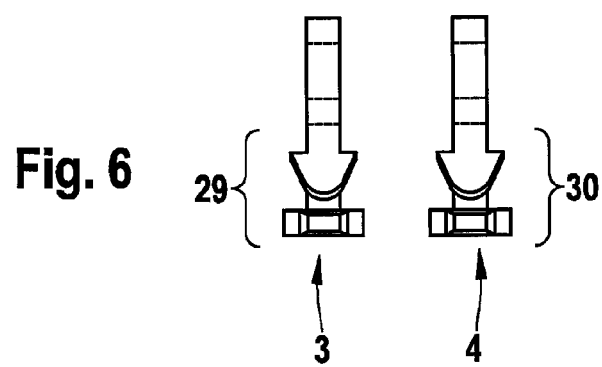
FIG. 6 shows a front view of both support elements according to the first exemplary embodiment.

FIGS. 4, 5, and 6 show first support element 3 and second support element 4 according to the first exemplary embodiment. FIG. 4 shows a top view and FIG. 6 shows a front view. In the side view according to FIG. 5, only first support element 3 is visible, since in this view, second support element 4 is located directly behind first support element 3, and also exactly corresponds to this first support element 3.

First support element 3 includes a first microcomponent support 23, a first spring element 25, a first contact spring section 27, a first main spring section 28, and a first detent 29. In exactly the same way, second support element 4 includes a second microcomponent support 24, a second spring element 26, and a second detent 30. In addition, second support element 4 includes a second contact spring section which is identical to first contact spring section 27, and a second main spring section which is identical to first main spring section 28. The second contact spring section and the second main spring section are not illustrated for the sake of clarity.

According to FIG. 5, first connecting pin 7 of first support element 3 merges directly into first microcomponent support 23. First microcomponent support 23 merges into first main spring section 28. This first main spring section 28 is a curved portion of first support element 3 having a sufficient radius, first support element 3 being bent at first main spring section 28 in such a way that the elastic force resulting from the bending separates first contact spring section 27 at a distance from first microcomponent support 23. First main spring section 28 merges directly into first contact spring section 27, which is bent in a curved shape. As a result of its curved design, this first contact spring section 27 faces first microcomponent support 23. This first contact spring section 27 in turn is bent by 90°, and merges into a locking tab connecting extension 31. A locking bolt 23 is provided at the end of this locking tab connecting extension 31. The exact design of first detent 29 and second detent 30 is described below with reference to FIG. 7. The design just described for first support element 3 applies in exactly the same way to second support element 4.

Figure 7:
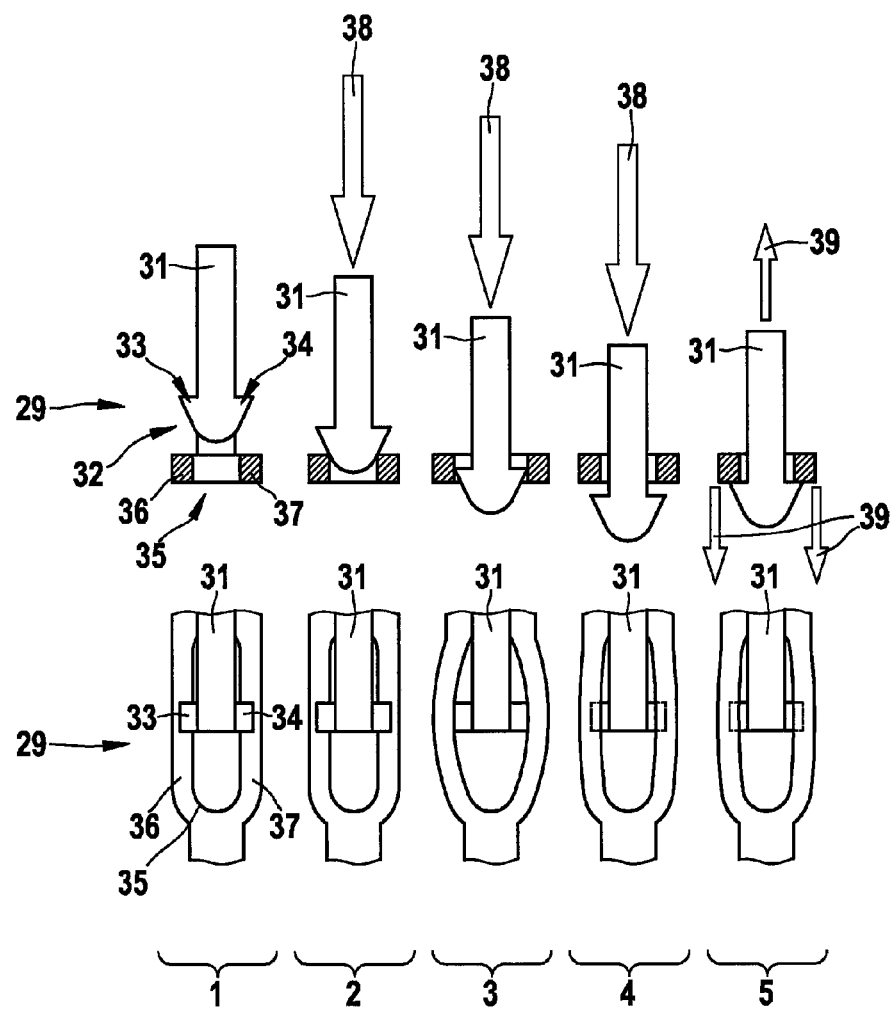
FIG. 7 shows a schematic sequence of engaging a detent according to the first exemplary embodiment.

FIG. 7 shows the design and the schematic sequence of a detent connection between support elements 3, 4 and spring elements 25, 26, using first detent 29 as an example.

First detent 29 includes detent connecting extension 31, which terminates in locking bolt 32. This locking bolt 32, in turn, is composed of a first locking tab 33 and a second locking tab 34. In the disengaged state of detent 29 a locking groove 35, designed as a detent spring, is situated opposite from locking bolt 32. This locking groove 35 is located in first microcomponent support 23 at the transition between first microcomponent support 23 and first connecting pin 7. Locking groove 35 is laterally delimited by a first elastic wall 36 and a second elastic wall 37. Locking groove 35 is designed as a detent spring as a result of these two elastic walls 36, 37.

FIG. 7 shows the engagement, i.e., locking, of detent 29 in five "snapshot" views. The first view shows the starting state before a mounting force 38 acts from above on detent connecting extension 31, i.e., from above on first spring element 25. In the second view, first support element 3 is supported from below, thus allowing mounting force 38 to be applied from above. Locking bolt 32 having first locking tab 33 and second locking tab 34 is designed in such a way that the two locking tabs are able to submerge into locking groove 35. In the third view it is clearly apparent that the widest point of locking bolt 32 is wider than the original width of locking groove 35. It is therefore particularly advantageous that walls 36 and 37 of locking groove 35 have an elastic design and thus have an elastic effect. The fourth view shows that locking bolt 32 is pushed so far through locking groove 35 that the widest point of locking bolt 32 has passed locking groove 35. At this moment, elastic walls 36, 37 spring back to their starting position and, as shown in the fifth view, hold detent 29 locked. Due to this locked first detent 29, first spring element 25 is blocked from springing back due to elastic force 39 from first main spring section 28.

Figure 8:
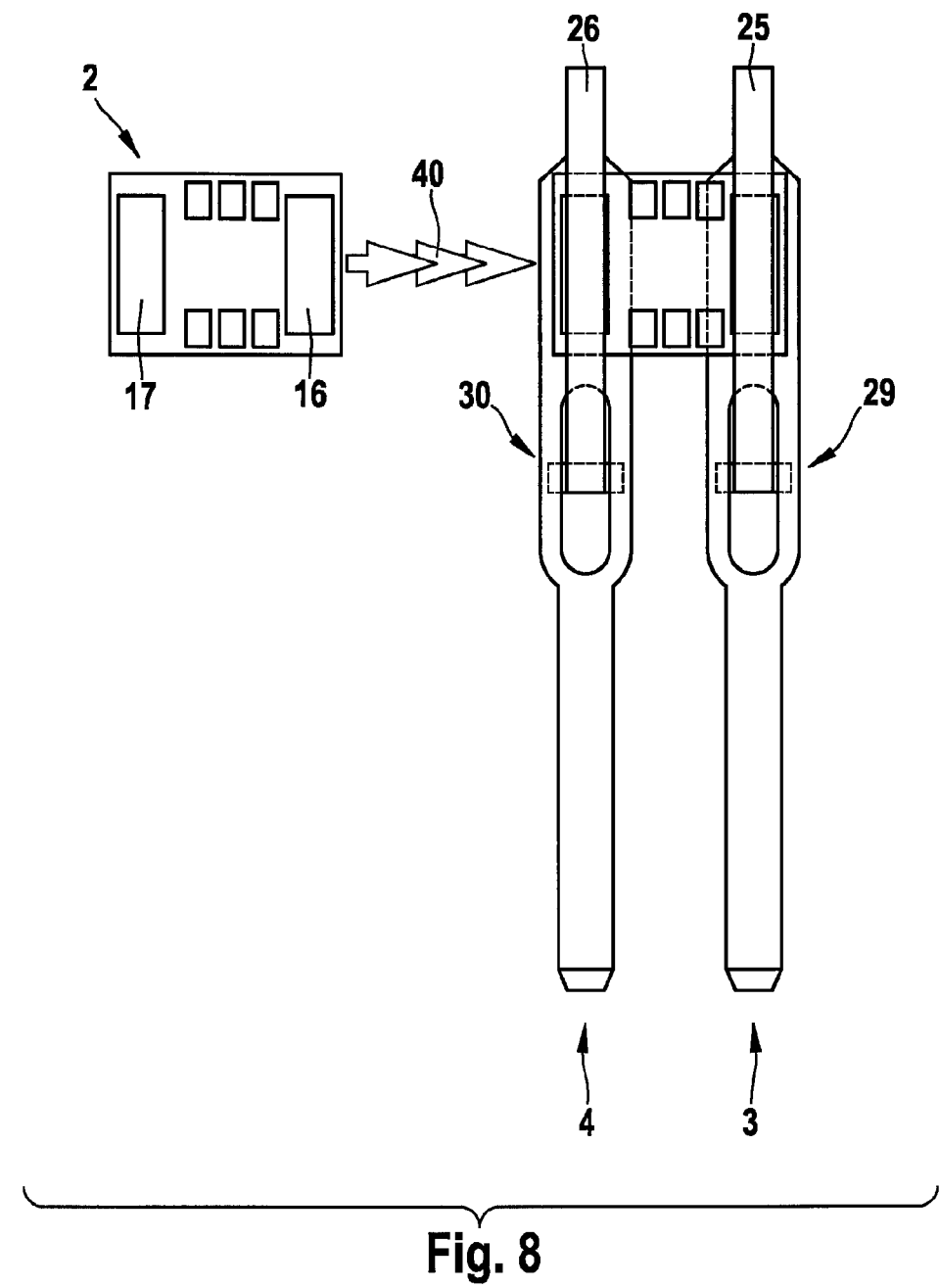
FIG. 8 shows installation of the microcomponent into the two support elements according to the first exemplary embodiment.

FIG. 8 shows the installation of microcomponent 2 into first support element 3 and second support element 4 according to the first exemplary embodiment. It is clearly apparent how microcomponent 2 is laterally pushed into the opening between contact spring section 27, 28 and microcomponent support 23, 24. Contact pads 16, 17 are positioned exactly beneath contact spring sections 27, 28. When detents 29, 30 lock, contact spring sections 27, 28 are thus pushed directly vertically onto contact pads 16, 17 from above, thus avoiding damage in the form of scratches or splinter-removing rubbing on contact pads 16, 17. Arrows 40 indicate this first installation direction in FIG. 8.

Figure 9:
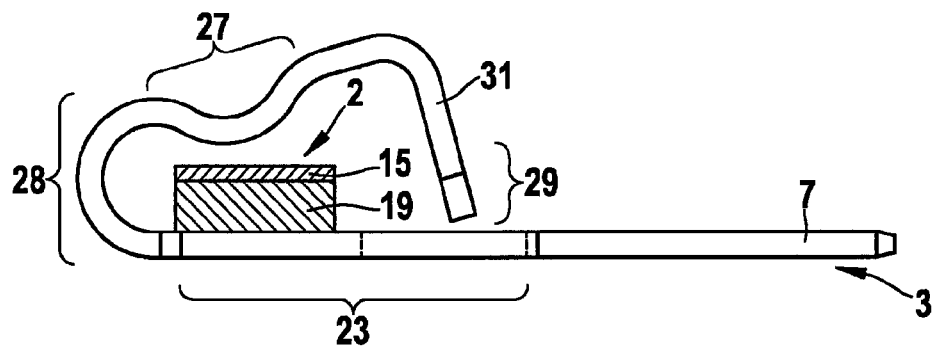
FIG. 9 shows a side view of the support element next to the positioned microcomponent according to the first exemplary embodiment.
Figure 10:
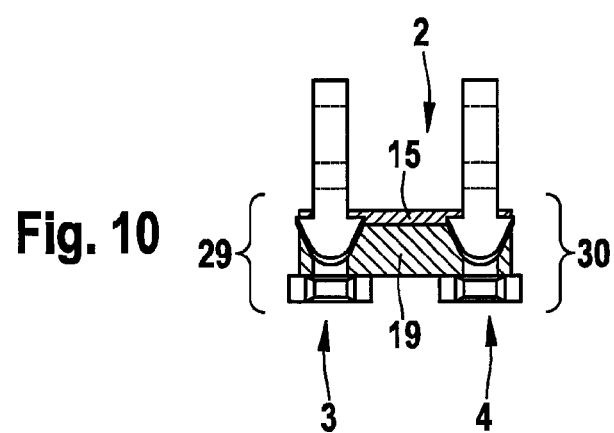
FIG. 10 shows a front view of both support elements together with the positioned microcomponent according to the first exemplary embodiment.

FIGS. 9 and 10 show the two support elements 3, 4 according to the first exemplary embodiment, having positioned microcomponent 2 with first detent 29 and second detent 30 still disengaged.

Figure 11:
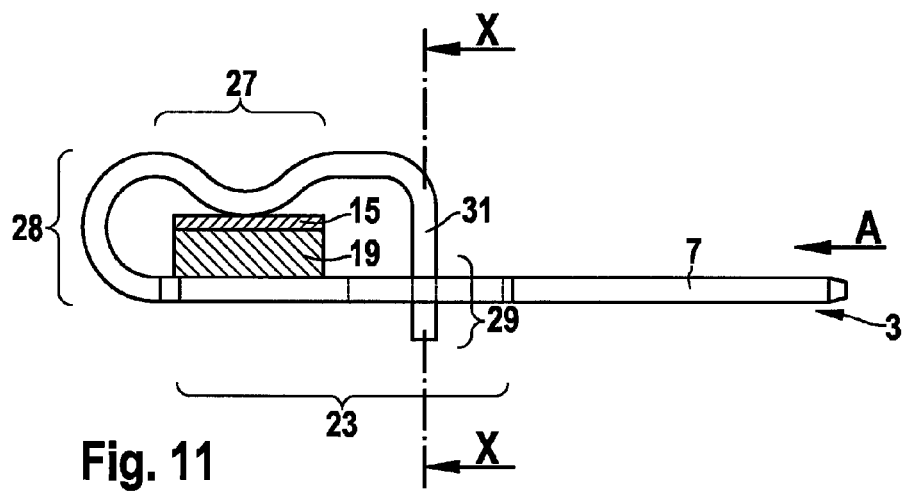
FIG. 11 shows a side view of a support element together with a locked detent according to the first exemplary embodiment.
Figure 12:
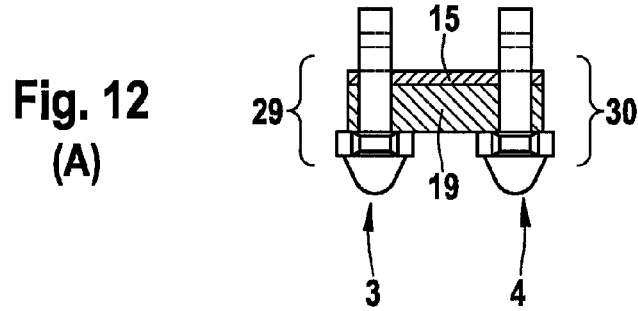
FIG. 12 shows a front view of both support elements together with a locked detent according to the first exemplary embodiment.
Figure 13:
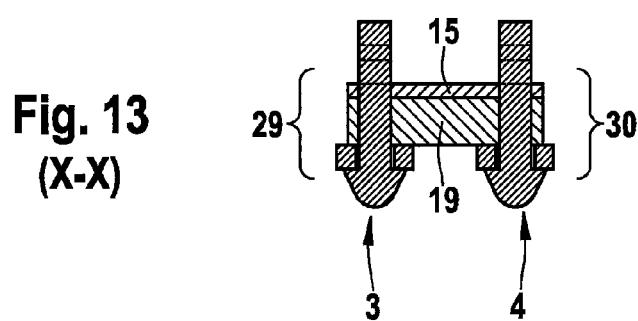
FIG. 13 shows a sectional view of both support elements together with a locked detent according to the first exemplary embodiment.

FIGS. 11, 12, and 13 show first support element 3 and second support element 4 with microcomponent 2 installed, and first detent 29 and second detent 30 engaged, according to the first exemplary embodiment. The cross section from FIG. 13 is indicated by X-X in FIG. 11. Arrow A in FIG. 11 shows the viewing direction of the view according to FIG. 12. FIG. 11 shows how first contact spring section 27 clamps and also contacts microcomponent 2.

FIG. 14 shows three different views of first support element 3 and second support element 4 with microcomponent 2 installed, and first detent 29 and second detent 30 engaged. In addition, first plastic coating 5 has been applied in an injection molding machine. This first plastic coating 5 is used to mechanically fix clamped microcomponent 2 to support elements 3, 4, and to decouple the stress during the subsequent injection molding process of second plastic coating 6. A semiflexible material, namely silicone, has been selected for first plastic coating 5.

Figure 15:
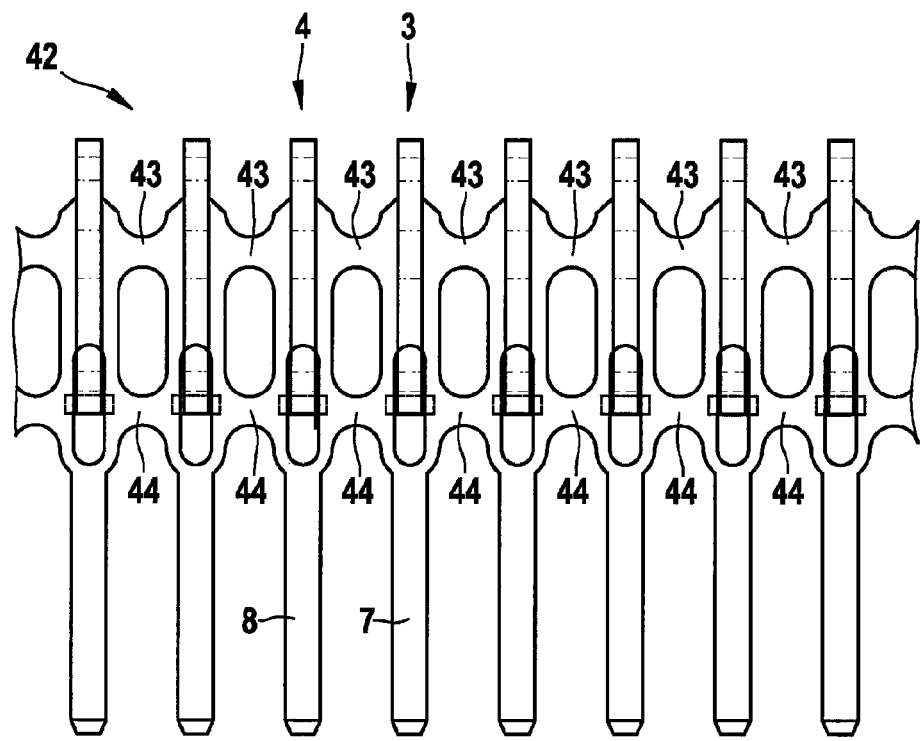
FIG. 15 shows a punching strip for manufacturing the support elements according to the first exemplary embodiment.
Figure 16:
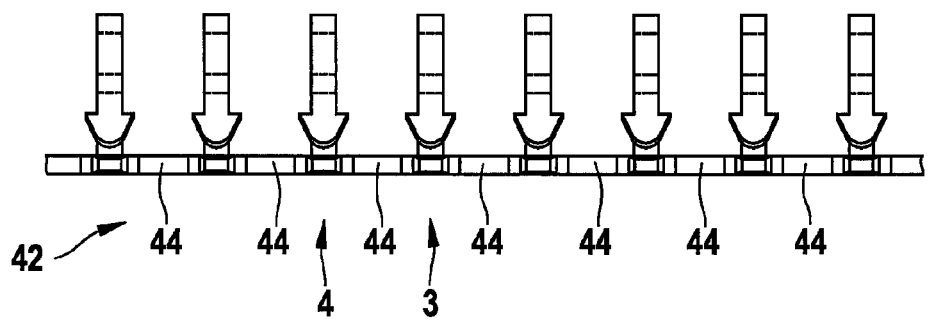
FIG. 16 shows a front view of the punching strip according to the first exemplary embodiment.

FIGS. 15 and 16 show a sheet metal punching strip 42 for producing support elements 3, 4 according to the first exemplary embodiment, in a top view and a front view. It is clearly apparent how various support elements 3, 4 are situated next to one another in sheet metal punching strip 42. Die-cuttable connecting regions 43, 44 are removed in a punching process in order to separate support elements 3, 4. Before separation, support elements 3, 4 are passed through a conveyorized metal-plating process.

Figure 17:
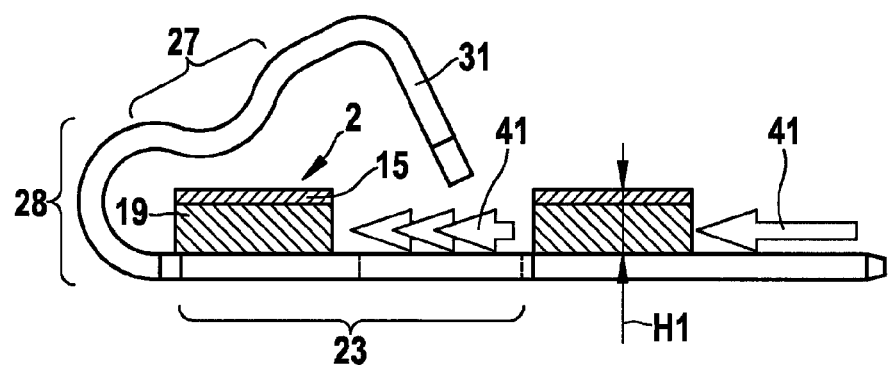
FIG. 17 shows installation of the microcomponent in two support elements according to a second exemplary embodiment.
Figure 18:
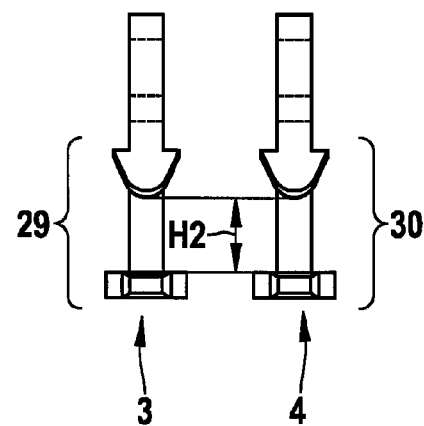
FIG. 18 shows a front view of the two support elements of the second exemplary embodiment.

FIGS. 17 and 18 show a second exemplary embodiment of electronic component 1. Identical or functionally equivalent parts are denoted by the same reference numerals as in the first exemplary embodiment. In addition, the second exemplary embodiment corresponds exactly to the first exemplary embodiment, except that in the second exemplary embodiment, in the disengaged state of detents 29, 30 locking bolt 32 is located at a farther distance from locking groove 35 than in the first exemplary embodiment. As a result, according to a second installation direction 41, illustrated in FIG. 17, microcomponent 2 may be pushed through between locking bolt 32 and locking groove 35, i.e., installed on microcomponent support 23. For this purpose, of course, a first height H1 of microcomponent 2 is less than a second height H2, second height H2 being the clearance between locking bolt 32 and locking groove 35, i.e., microcomponent support 23.

Thus, the two exemplary embodiments show how electronic component 1 according to the present invention is advantageously designed. In particular, it has also been clearly shown how the method according to the present invention proceeds, and which advantageous role sheet metal punching strip 42 plays in producing support elements 3, 4. Illustrated electronic component 1 allows microcomponent 2 to be connected to and contacted with support elements 3, 4 without thermal joining processes, and without the risk of metallic conductive particles or splinters. In addition, a sufficient contact force has been applied to contact pads 16, 17 with the aid of the contact spring sections, so that the mechanical as well as electrical/electronic connection between microcomponent 2 and support elements 3, 4 functions reliably under the basic conditions of the injection molding process, and also over the entire service life of electronic component 1.

What is claimed is:

1. An electronic component, comprising:
    at least one microcomponent;
    a support element, a first surface of the support element including a locking groove or cut;
    a spring element, a first end of the spring element terminating in at least one locking tab and a second, opposite end of the spring element being connected to the support element;
    wherein:
        the spring element contacts the microcomponent is contacted with and fastened and fastens the microcomponent to the support element; and
        the at least one locking tab is extendible into the locking groove or cut to engage the support element and fasten the at least one microcomponent to the support element.

2. The electronic component as recited in claim 1, wherein the spring element includes a contact spring section configured for contacting the microcomponent and the support element.

3. The electronic component as recited in claim 2, wherein:
the support element includes a microcomponent support;
the microcomponent support merges into a main spring section of the spring element; and
the main spring section merges into the contact spring section.

4. The electronic component as recited in claim 2, wherein the support element is configured for inserting the microcomponent between the contact spring section and the microcomponent support, and wherein the contact spring section is curved around the microcomponent support.

5. The electronic component as recited in claim 1, wherein two support elements are provided and separated from one another, each of the support elements including a groove or cut for extension therein of a respective locking tab in order to fasten and contact the microcomponent with the aid of the two support elements.

6. The electronic component as recited in claim 5, wherein the microcomponent includes two contact pads, and each contact pad is connected via a contact spring section to a corresponding connecting pin provided on the support element.

7. The electronic component as recited in claim 1, wherein the locking groove or cut is laterally delimited by elastic walls which provide for the at least one locking tab to be submerged into the locking groove or cut.

8. The electronic component as recited in claim 1, further comprising:
a first plastic coating and a second plastic coating, wherein the first plastic coating encapsulates the microcomponent together with at least a portion of the support element, and wherein interfaces for connecting the electronic component are provided at the second plastic coating.

9. The electronic component as recited in claim 1, wherein the electronic component is a sensor for use in a motor vehicle, and wherein the microcomponent includes a microelectromechanical sensor.

10. The electronic component as recited in claim 1, wherein elastic walls of the locking groove or cut varies a width of the locking groove or cut in which the at least one locking tab is received.

11. The electronic component as recited in claim 1, wherein at least two locking tabs form a locking bolt, the locking bolt being submergible into the locking groove or cut such that responsive to a widest point of the locking bolt passing the locking groove or cut, elastic walls of the locking groove or cut return to their starting position and prevent the at least two locking tabs of the locking bolt from slipping out of the locking groove or cut.

12. The electronic component as recited in claim 1, wherein the support element is formed from a single sheet of metal.

13. The electronic component as recited in claim 1, wherein the support element and the spring element, including the at least one locking tab, are integrally produced from a single sheet of metal that is bent to form the support and spring elements.

14. A method for manufacturing an electronic component, comprising:
integrally producing a support element including a detent and a spring element from bent sheet metal;
configuring the support element such that the spring element is configured for fastening at least one microcomponent;
inserting the at least one microcomponent between a contact spring section of the spring element and a microcomponent support of the support element;
closing the spring element against an elastic force; and
engaging the detent between the spring element and the support element.

15. The method as recited in claim 14, wherein the integrally producing includes producing the support element from a single sheet of metal.

16. The method according to claim 14, wherein the detent includes at least one locking tab that is extendible into a locking groove or cut in a surface of the support element, one end of the spring element terminating in the at least one locking tab.

17. A sheet metal punching strip configured for manufacturing electronic components, the sheet metal punching strip comprising:
multiple support elements, each including a spring element and a detent, and connected to one another via die-cuttable connecting regions, such that when the support elements are separated from one another by punching the sheet metal punching strip, they each form a part of the electronic components;
wherein:
each electronic component includes at least one microcomponent and at least one of the support elements;
the microcomponent is contacted with and fastened to the respective at least one support element;
a surface of the support element includes a locking groove or cut; and
the spring element of each respective support element terminates in at least one locking tab, the locking tab being extendible into the locking groove or cut to engage the support element and to fasten the at least one microcomponent to the support element.

* * * * *